(12) United States Patent
Berthoud et al.

(10) Patent No.: US 6,191,559 B1
(45) Date of Patent: Feb. 20, 2001

(54) BATTERY CAPACITY CALCULATOR AND METHOD OF CALCULATING BATTERY CAPACITY

(75) Inventors: Charles W. Berthoud, Nazareth; Mohd M. Hobbi; Lakshmi N. Jampanaboyana, both of Allentown, all of PA (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/481,264

(22) Filed: Jan. 11, 2000

(51) Int. Cl.[7] .................. H02J 7/14; G01N 27/416
(52) U.S. Cl. ........................... 320/136; 324/427
(58) Field of Search .................. 320/136, 134, 320/132; 324/427, 428

(56) References Cited

U.S. PATENT DOCUMENTS 5,998,971 * 12/1999 Corbridge ..................... 320/132
6,054,861 * 4/2000 Takahashi ..................... 324/428

* cited by examiner

Primary Examiner—Peter S. Wong
Assistant Examiner—Gregory J. Toatley, Jr.

(57) ABSTRACT

A system for, and method of, calculating a capacity of a rechargeable battery having an initial terminal voltage and a battery power supply incorporating the system or the method. In one embodiment, the system includes: (1) a dummy load couplable to the battery to initiate a battery discharge cycle of a given discharge rate and (2) a controller, coupled to the dummy load, that periodically collects, and generates an accumulation of, terminal voltage samples during the battery discharge cycle until the terminal voltage reaches a predefined terminating level, the capacity being a function of a magnitude of the accumulation.

21 Claims, 3 Drawing Sheets

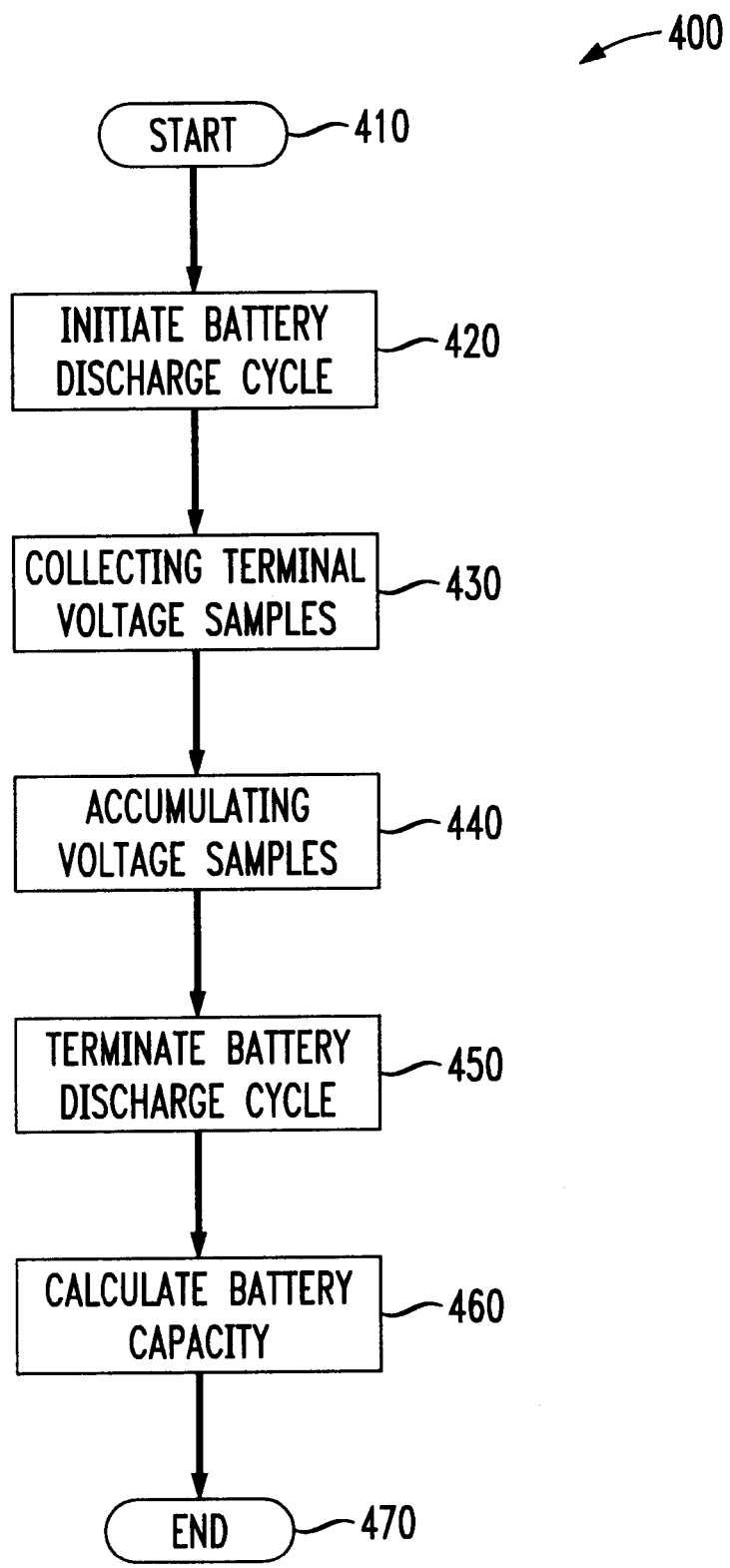

BATTERY CAPACITY CALCULATOR AND METHOD OF CALCULATING BATTERY CAPACITY

TECHNICAL FIELD OF THE INVENTION

The present invention is directed, in general, to a battery management system and, more specifically, to a device and method for calculating the remaining capacity of a battery used in devices such as cordless telephones.

BACKGROUND OF THE INVENTION

People using cellular telephones have become so common that they scarcely warrant attention. The cellular telephone has become a part of America's pop culture. Individuals push shopping carts through the aisles of the local supermarket while carrying on a conversation with friends (who, perhaps, are also talking on a cellular phone) and we regard it as normal behavior. Cellular telephones have become so pervasive that new etiquette rules regarding acceptable behavior in using cellular telephones continue to develop. It is no longer considered proper, for instance, to carry on a cellular phone conversation in a restaurant where it will disturb nearby diners. Likewise, some consider using a cellular phone while driving to constitute behavior as hazardous to others as that of drinking alcoholic beverages and then driving an automobile.

In addition to securing a place in pop culture, the cellular telephone and similar devices, such as pagers and portable computers, have dramatically impacted modern business practices. The fact that people have nearly constant contact with each other has shortened the time within which business transactions can be completed. The pervasiveness of pagers, cellular telephones and modem equipped portable computers has raised the expectations of people who expect to be able to establish contact with, and be contacted by, anyone at nearly any time. We are reminded of this every time we see a person sending or receiving email on a portable computer while waiting for an airplane or when we see people using their cell phone to check for messages or return phone calls during intermission at the theater or a break in a seminar.

Although cellular phones, pagers and portable computer modems have given us the capability to be in contact nearly everywhere at any time, the usefulness of such devices is limited by the devices' power supply. Other portable electronic devices, such as answering machines, cordless telephones and video cameras, also have the same limitation. The majority of such devices use a DC battery power supply. In some cases the device is powered by disposable batteries, while other devices are powered by a rechargeable battery or batteries. In most higher end devices, such as portable computers or cellular telephones, a rechargeable battery is used.

Rechargeable batteries used in cellular telephones and portable computers generally can be used for limited number of hours before the battery or batteries must be recharged. The ability of the battery being able to accept and retain a charge is limited by the length of time the battery has been in use and the number of recharging cycles that the battery has undergone. With the passage of time, the capacity or ability of a battery to hold a charge diminishes due to battery deterioration. Similarly, each time a battery is recharged, its capacity to hold a charge is slightly diminished from the charge it could hold before the preceding recharging cycle. This means that an older battery or one that has been through a number of recharging cycles, or both, although it can be fully charged, will lose its charge much faster than a newer battery or one that has not gone through a number of recharging cycles.

In most cases, the user of a cellular telephone or portable computer does not notice the gradual deterioration of battery capacity that is taking place. This lack of awareness can place a user in the awkward position of having his or her cell phone cease operation in the middle a phone call or a computer having to be shut down at a critical time. It can mean that a fully charged video camera will prematurely cease to operate during an important personal event, such as a wedding, a child's soccer game or a piano recital.

In many such instances the user of the device may have started out with a fully charged battery, but had no indication of the capacity of the battery to hold the charge. Even if the user has a replacement battery, the cell phone, computer, or video camera, as the case may be, must be stopped while the battery is being replaced. If the user does not have a replacement battery, he or she must wait until they can procure one or they have access to AC power so they can either recharge the weak battery or operate the device off its charging device. If the user of the cell phone, computer, video camera or other battery powered device had an indication of the true capacity of the battery before hand, he or she may have been able to plan accordingly by either minimizing use of the device or by replacing the battery with one having an acceptable remaining capacity.

Accordingly, what is needed in the art is a device and method to calculate the remaining capacity of a battery so a user of a battery powered device knows when he or she should replace the battery.

SUMMARY OF THE INVENTION

To address the above-discussed deficiencies of the prior art, the present invention provides a system for, and method of, calculating a capacity of a rechargeable battery having an initial terminal voltage and a battery power supply incorporating the system or the method. In one embodiment, the system includes: (1) a dummy load couplable to the battery to initiate a battery discharge cycle of a given discharge rate and (2) a controller, coupled to the dummy load, that periodically collects, and generates an accumulation of, terminal voltage samples during the battery discharge cycle until the terminal voltage reaches a predefined terminating level, the capacity being a function of a magnitude of the accumulation.

The present invention therefore introduces the broad concept of determining battery capacity by draining the battery at a known rate and accumulating terminal voltage readings to gain an understanding of the response of the battery to the draining. In this manner, capacity can be determined by way of relative voltage readings.

In one embodiment of the present invention, the system further includes a battery capacity indicator, coupled to the controller, that indicates the capacity to a user. The indicator, while not necessary to the present invention, advantageously gives the user an indication of capacity. The indicator may be of any conventional or later-discovered type.

In one embodiment of the present invention, the battery capacitor indicator activates a warning signal when the battery capacity is less than a predefined limit. Although not required, the warning signal may be visual, auditory or of any other appropriate type or combination thereof.

In one embodiment of the present invention, the battery is couplable to a battery-powered electronic apparatus. The battery-powered electronic apparatus may be: (1) a telephone answering device, (2) a cordless telephone, (3) a video camera or (4) any conventional or later-discovered load capable of being battery powered and preferably for which battery capacity is a germane consideration.

In one embodiment of the present invention, the battery discharge cycle is initiated when the battery-powered electronic apparatus is inactive. While not necessary to the present invention, this prevents the battery discharge cycle from adversely affecting operation of the battery-powered electronic apparatus. In a related embodiment of the present invention, the controller terminates the battery discharge cycle if the battery-powered electronic apparatus is activated. Again, although not necessary to the present invention, the system can be advantageously constructed so as not to interfere with the operation of the battery-powered electronic apparatus.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 4 illustrates an embodiment of a method to calculate the capacity of a rechargeable battery that has an initial terminal voltage.

DETAILED DESCRIPTION

Figure 1:
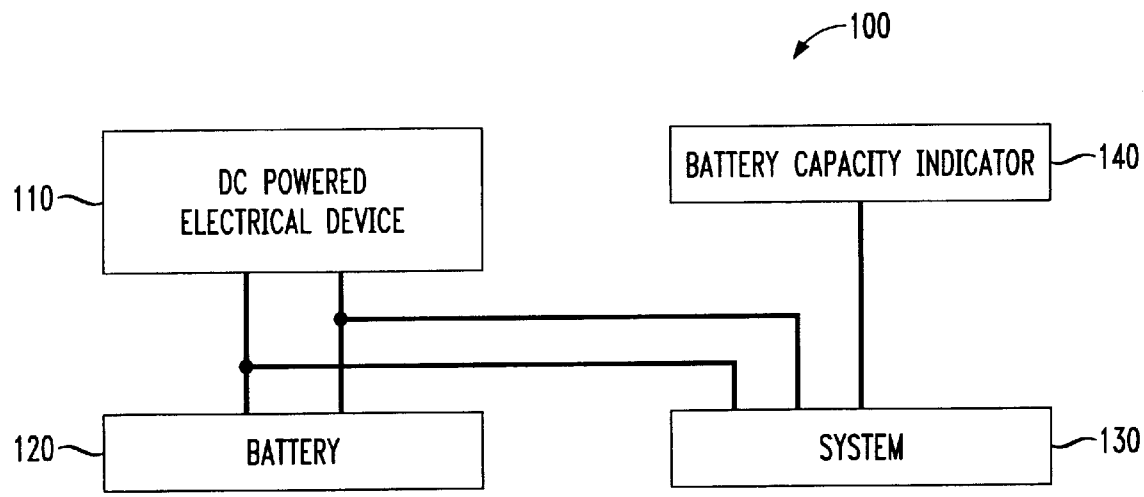
FIG. 1 illustrates a block diagram of a DC powered electrical device operated by a rechargeable battery with a system used to measure the capacity of the battery.

Referring initially to FIG. 1, illustrated is a block diagram 100 of a DC powered electrical device 110 operated by a rechargeable battery 120 with a system 130 to measure the capacity of the battery 120. The illustrated embodiment also has a battery capacity indicator 140 whereby the system 130 can give an indication to the user of the device 110 of the remaining capacity of the battery 120. The electrical device 110 represented can be any one of several devices 110 commonly powered by a rechargeable battery 120, such as a cellular telephone, portable computer or video camera. Although the present invention is particularly useful with portable devices 110 powered by a rechargeable battery 120, the invention is not limited to portable devices 110 and is also intended to be used with larger devices 110, including those having a fixed location, that are powered by one or more rechargeable batteries 120.

When the illustrated DC powered device 110 is activated, the device 110 places a load on the battery 120 and causes the battery 120 to commence a discharge cycle from its initial terminal voltage. Although the battery 120 may have been fully charged, prior art systems do not calculate the capacity of the battery 120 to hold the charge. Prior art systems may show that the battery 120 is being discharged and may give the user a low voltage warning. Notwithstanding the receipt of a low voltage warning, however, the user will not know the remaining capacity of the battery 120 powering the device 110 and will not be able to plan his or her use of the device 110 in accordance with the remaining battery 120 capacity, such as limiting its use or changing the battery 120. In order to address this prior art shortfall, the present invention provides a system 130, couplable to the battery 120, to calculate the capacity of a rechargeable battery 120.

Figure 2:
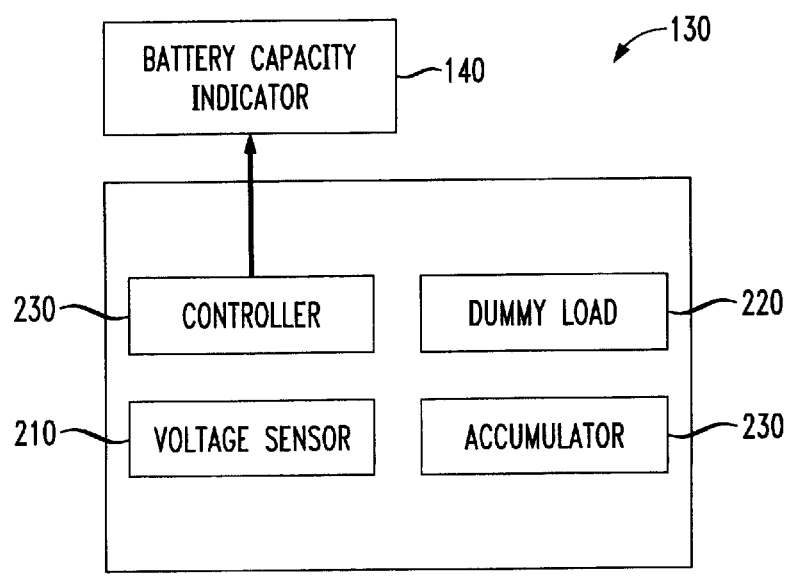
FIG. 2 illustrates a block diagram of a system constructed in accordance with the present invention used to calculate the battery capacity of a rechargeable battery.

Turning now to FIG. 2, illustrated is a block diagram of a system 130, constructed in accordance with the present invention, that is used to calculate the battery capacity of a rechargeable battery 120. The system 130 has a voltage sensor 210 that is used to sense battery 120 voltage, commencing with the battery's 120 initial terminal voltage. In order to start a voltage discharge cycle, the system 130 couples a dummy load 220 to the battery 120 and starts a discharge cycle at a given discharge rate. The system 130 is run by a controller 230 that, among other tasks, periodically collects, and generates an accumulation of, terminal voltage samples during the battery 120 discharge cycle. The sample terminal voltage readings taken by the voltage sensor 210 are collected by the controller 230 and sent to an accumulator 230. The accumulator 230 accumulates sample terminal voltages from the time the dummy load 210 is coupled to the battery 120 and starts the discharge cycle until the battery 120 terminal voltage reaches a predefined terminating level. When the battery 120 reaches the predefined terminating level, the controller 230 ceases its sampling and disconnects the dummy load 210. The remaining capacity of the battery 120 can then be determined as a function of the magnitude of the accumulated terminal voltage samples. The "relative" capacity is calculated by integrating the measured terminal voltages over time and comparing the result to a value that may: (1) have been obtained from the battery manufacturer, (2) have been calculated when the battery was first installed and assumed to be new or (3) be predetermined or calculated at any other suitable time.

Figure 3:
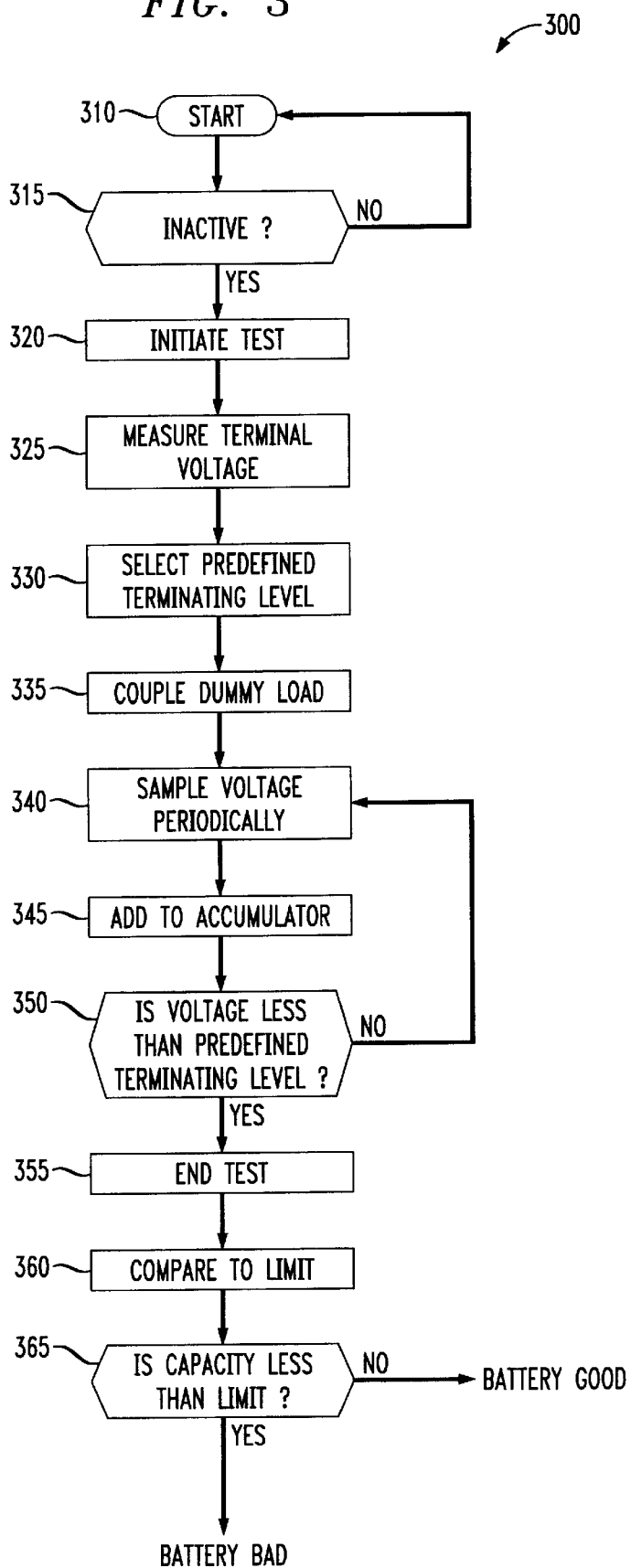
FIG. 3 illustrates a diagram of a method of determining battery capacity in accordance with the present invention.

Turning now to FIG. 3, illustrated is a flow diagram 300 of a method of determining battery 120 capacity in accordance with the present invention. The specific circuitry to perform the various tasks is not set forth because those of ordinary skill in the art will understand the specific circuitry that is required. Those of ordinary skill in the art will also understand that different sequences of steps can be used and that steps can be added, subtracted or combined to determine battery capacity and still be within the intended scope of the present invention.

The determination of battery 120 capacity in the illustrated embodiment commences with a start step 310. In a first question 315, the controller asks if the battery is inactive. If the device powered by the battery is being used, the answer to the first question 315 is "no" and the system returns to the start step 310. If the answer to the first question 315 is "yes," the system determines battery capacity by commencing an initiate test step 320.

After the initiate test step 320, the controller measures the initial terminal voltage in a measure terminal voltage step 325. In a select predefined terminating level step 330, the controller determines at what predetermined voltage measured across the battery terminals will the test be complete.

In order to initiate the battery discharge cycle, a dummy load is coupled across the battery terminals in a couple dummy load step 335.

The controller periodically samples the voltage while the battery is being discharged in a sample voltage periodically step 340. The results of the voltage samples taken during the sample voltage periodically step 340 are transferred to an accumulator. Each of the voltage samples are accumulated in an add to accumulator step 345.

In a second question 350, the controller asks whether the voltage has reached the predefined termination level determined during the select predefined terminating level step 330. If the answer is "no," the controller continues to take sample voltages in the sample voltage periodically step 340. If the answer is "yes," the test is ended in an end test step 355.

The controller uses an algorithm to determine battery capacity as a function of time and magnitude of the accumulation of voltage samples. In a compare to limit step 360 the controller compares the battery capacity with a predefined limit. In a third question 365, an inquiry is made of whether the battery capacity is less than a predefined limit. If the battery capacity is more than the predefined limit, the battery is determined to be good. If the battery capacity is less than the predefined limit, the battery is determined to be bad. The present invention is not, however, limited to determining good versus bad, and may categorize in any suitable manner.

Referring back to FIGS. 1 and 2, in one embodiment of the invention the system 130 includes a battery capacity indicator 140 coupled to the controller to furnish information to the user as to the remaining capacity of the battery 120. This information may be transmitted to the user in a variety of forms, such as, for example, a tone or buzzer giving a warning signal that the battery capacity is less than the predefined limit. Those of ordinary skill in the art will understand that a battery capacity indicator 140 may take a variety of different forms, both known and later discovered, and still be within the intended scope of the present invention.

Turning now to FIG. 4, illustrated is an embodiment of a method 400 to calculate the capacity of a rechargeable battery that has an initial terminal voltage. The method 400 commences with a start step 410. In an initiating battery discharge cycle step 420, a battery discharge cycle is initiated at a given discharge rate. In a collecting terminal voltage samples step 430, samples of the battery terminal voltage are periodically collected during the discharge cycle. In an accumulating voltage samples step 440, the periodically collected terminal voltage samples taken during the battery discharge cycle are accumulated. In a terminate battery discharge cycle step 450, the battery discharge cycle is terminated at the predefined terminating level. In a calculate battery capacity step 460, an algorithm is used to determine the capacity of the battery as a function of the magnitude of the accumulation. The method 400 concludes with an end step 470.

Although the present invention has been described in detail, those skilled in the art should understand that various changes, substitutions and alterations can be made to the foregoing method of calculating the capacity of a rechargeable battery and that such changes, substitutions, and alterations will be within the intended scope of the present invention.

What is claimed is:

1. A system for calculating a capacity of a rechargeable battery having an initial terminal voltage, comprising:

a dummy load couplable to said battery to initiate a battery discharge cycle of a given discharge rate; and a controller, coupled to said dummy load, that periodically collects, and generates an accumulation of, terminal voltage samples during said battery discharge cycle until said terminal voltage reaches a predefined terminating level, said capacity being a function of a magnitude of said accumulation.

2. The system as recited in claim 1 further comprising a battery capacity indicator, coupled to said controller, that indicates said capacity to a user.

3. The system as recited in claim 2 wherein said battery capacitor indicator activates a warning signal when said battery capacity is less than a predefined limit.

4. The system as recited in claim 1 wherein said battery is couplable to a battery-powered electronic apparatus.

5. The system as recited in claim 4 wherein said battery discharge cycle is initiated when said battery-powered electronic apparatus is inactive.

6. The system as recited in claim 4 wherein said controller terminates said battery discharge cycle if said battery-powered electronic apparatus is activated.

7. The system as recited in claim 4 wherein said battery-powered electronic apparatus is selected from the group consisting of:

a telephone answering device, a cordless telephone, and a video camera.

8. A method of calculating a capacity of a rechargeable battery having an initial terminal voltage, comprising:

initiating a battery discharge cycle of a given discharge rate; and periodically collecting, and generating an accumulation of, terminal voltage samples during said battery discharge cycle until said terminal voltage reaches a predefined terminating level, said capacity being a function of a magnitude of said accumulation.

9. The method as recited in claim 8 further comprising indicating said battery capacity to a user.

10. The method as recited in claim 8 further comprising activating a warning signal when said battery capacity is less than a predefined limit.

11. The method as recited in claim 8 further comprising coupling said battery to a battery-powered electronic apparatus.

12. The method as recited in claim 11 further comprising initiating said battery discharge cycle only when said battery-powered electronic apparatus is inactive.

13. The method as recited in claim 11 further comprising terminating said battery discharge cycle if said battery-powered electronic apparatus is activated.

14. The method as recited in claim 11 wherein said battery-powered electronic apparatus is selected from the group consisting of:

a telephone answering device, a cordless telephone, and a video camera.

15. A battery power supply, comprising:

a rechargeable battery having an initial terminal voltage; and a system for calculating a capacity of said battery, including:

a dummy load couplable to said battery to initiate a battery discharge cycle of a given discharge rate, and a controller, coupled to said dummy load, that periodically collects, and generates an accumulation of, terminal voltage samples during said battery discharge cycle until said terminal voltage reaches a predefined terminating level, said capacity being a function of a magnitude of said accumulation.

16. The battery power supply as recited in claim 15 wherein said system further includes a battery capacity indicator, coupled to said controller, that indicates said capacity to a user.

17. The battery power supply as recited in claim 16 wherein said battery capacitor indicator activates a warning signal when said battery capacity is less than a predefined limit.

18. The battery power supply as recited in claim 15 wherein said battery is coupled to a battery-powered electronic apparatus.

19. The battery power supply as recited in claim 18 wherein said controller initiates said battery discharge cycle when said battery-powered electronic apparatus is inactive.

20. The battery power supply as recited in claim 18 wherein said controller terminates said battery discharge cycle if said battery-powered electronic apparatus is activated.

21. The battery power supply as recited in claim 18 wherein said battery-powered electronic apparatus is selected from the group consisting of:

a telephone answering device, a cordless telephone, and a video camera.

* * * * *